United States Patent [19]
Tustaniwskyj et al.

[11] Patent Number: 5,424,580
[45] Date of Patent: Jun. 13, 1995

[54] ELECTRO-MECHANICAL ASSEMBLY OF HIGH POWER AND LOW POWER IC PACKAGES WITH A SHARED HEAT SINK

[75] Inventors: Jerry I. Tustaniwskyj, Mission Viejo; Stephen A. Smiley, San Diego, both of Calif.

[73] Assignee: Unisys Corporation, Blue Bell, Pa.

[21] Appl. No.: 145,932

[22] Filed: Nov. 1, 1993

[51] Int. Cl.⁶ .............................................. H01L 23/02
[52] U.S. Cl. ..................................... 257/713; 257/719; 257/722; 257/724; 361/709; 361/716; 361/718
[58] Field of Search ................. 257/712, 713, 718, 719, 257/722, 723, 724; 361/709, 716, 717, 718, 719, 722

[56] References Cited

U.S. PATENT DOCUMENTS

| | | | |
|---|---|---|---|
| 4,561,011 | 12/1985 | Kohara et al. | 257/713 |
| 5,168,348 | 12/1992 | Chu et al. | 257/713 |
| 5,251,100 | 10/1993 | Fujita et al. | 257/713 |
| 5,270,902 | 12/1993 | Bellar et al. | 257/713 |
| 5,289,337 | 2/1994 | Aghazadeh et al. | 257/712 |
| 5,296,739 | 3/1994 | Heilbronner et al. | 257/718 |

FOREIGN PATENT DOCUMENTS

0508179  10/1992  European Pat. Off. ............ 257/713

*Primary Examiner*—Rolf Hille
*Assistant Examiner*—David Ostrowski
*Attorney, Agent, or Firm*—Charles J. Fassbender; Mark T. Starr; Stanton D. Weinstein

[57] ABSTRACT

An electro-mechanical assembly includes a high power IC package and a low power IC package which are mounted with a space between them on a single substrate. Both of these IC packages have flat top surfaces which dissipate heat; and due to various manufacturing tolerances, those surfaces are non-coplanar with respect to each other. To cool these two IC packages, a single heat sink is provided which has a thin flat core that overlies both of the IC packages as well as the space between them, and cooling fins extend from the top of the core. A pair of contact regions are provided on the bottom of the core which respectively are supported by the flat surfaces of the IC packages; and the contact region for the high power IC package is a projection from the core which is a) substantially smaller in average cross-sectional area, parallel to the core, than the flat surface of the high power IC package, b) aligned with a high power chip in the high power IC package, and c) long enough to prevent any portion of the core from touching the flat surface of the high power IC package, despite its non-coplanarity.

15 Claims, 6 Drawing Sheets eq. 1) $THS_{14} - T_{AIR} = \dfrac{W_{12} + W_{13}}{h\, S_{14}}$ eq. 2) $THS_{14}$ = TEMPERATURE OF HEATSINK 14
$T_{AIR}$ = TEMPERATURE OF AIR AROUND HEATSINK
$W_{12}$ = POWER DISSIPATED BY CHIP 12A
$W_{13}$ = POWER DISSIPATED BY CHIP 13A
$h$ = HEAT TRANSFER COEFFICIENT OF HEATSINK TO AIR
$S_{14}$ = SURFACE AREA OF HEATSINK 14 eq. 3) $THS_{14}' - T_{AIR} = \dfrac{W_{12}}{h\, S_{14}'}$ eq. 4) $THS_{14}'$ = TEMPERATURE OF HEATSINK FOR IC PACKAGE 12 ONLY
$S_{14}'$ = SURFACE AREA OF HEATSINK IC PACKAGE 12 ONLY eq. 5) $\dfrac{THS_{14}' - T_{AIR}}{THS_{14} - T_{AIR}} = \left[\dfrac{W_{12}}{W_{12} + W_{13}}\right]\left[\dfrac{S_{14}}{S_{14}'}\right]$ eq. 6) $W_{12} = 16$ WATTS, $W_{13} = 4.5$ WATTS, $S_{14} = 2 S_{14}'$ eq. 7) $\dfrac{THS_{14}' - T_{AIR}}{THS_{14} - T_{AIR}} = \left[\dfrac{16}{16 + 4.5}\right][2] = 156\%$

FIG. 2 eq. 20) $\Delta T_{15A} = \dfrac{(t_1)(W_{12})}{(k_{GR})(A_1)}$ eq. 21) $\Delta T_{15A}$ = AVERAGE TEMPERATURE RISE THROUGH GREASE 15A $t_1$ = AVERAGE THICKNESS OF GREASE 15A $A_1$ = AREA OF HEATFLOW PATH THROUGH GREASE 15A $W_{12}$ = POWER DISSIPATED BY CHIP 12A $k_{GR}$ = THERMAL CONDUCTIVITY OF GREASE 15A eq. 22) $\Delta T_{15A'} = \dfrac{(t_2)(W_{12})}{(k_{GR})(A_2)}$ eq. 23) $\Delta T_{15A'}$ = AVERAGE TEMPERATURE RISE THROUGH GREASE 15A'

$t_2$ = AVERAGE THICKNESS OF GREASE 15A'

$A_2$ = AREA OF HEATFLOW PATH THROUGH GREASE 15A' eq. 24) $\dfrac{\Delta T_{15A'}}{\Delta T_{15A}} = \left(\dfrac{A_1}{A_2}\right)\left(\dfrac{t_2}{t_1}\right)$ eq. 25a) $A1 \approx A2 \approx (2x_1)^2$ eq. 25b) $t1 = \left(\dfrac{x_1}{x_2}\right) t_2$ eq. 26) $\dfrac{\Delta T_{15A'}}{\Delta T_{15A}} = \dfrac{x_2}{x_1}$ eq. 27) $2x_1 = 0.85"$, $2x_2 = 2.16"$ eq. 28) $\dfrac{\Delta T_{15A'}}{\Delta T_{15}} = \dfrac{1.95}{0.85} = 254\%$

FIG. 3

FIG. 8 eq.51) $W_{12} \rightarrow W_{42}$ = POWER DISSIPATED BY IC PACKAGE 42

$W_{13} \rightarrow W_{43-1} + W_{43-2} + W_{43-3}$ = POWER DISSIPATED BY LOW POWER IC PACKAGES $S_{14} \rightarrow S_{44}$ = SURFACE AREA OF HEATSINK 44

$S_{14}' \rightarrow S_{44}'$ = SURFACE AREA OF HEATSINK FOR IC PACKAGE 42 ONLY $THS_{14} \rightarrow THS_{44}$ = TEMPERATURE OF HEATSINK 44

$THS_{14}' \rightarrow THS_{44}'$ = TEMPERATURE OF HEATSINK FOR IC PACKAGE 42 ONLY eq.52) $\dfrac{THS_{44}' - T_{AIR}}{THS_{44} - T_{AIR}} = \left(\dfrac{W_{42}}{W_{42} + W_{43-1} + W_{43-2} = W_{43-3}}\right)\left(\dfrac{S_{44}}{S_{44}'}\right)$ eq.53) $W_{42}$ = 16 WATTS $W_{43-1} = W_{43-2} = W_{43-3}$ = 1.5 WATTS $S_{44}$ = (5.75)(2.5) IN$^2$ $S_{44}'$ = (2.5)(2.5) IN$^2$ eq.54) $\dfrac{THS_{44}' - T_{AIR}}{THS_{44} - T_{AIR}} = \left(\dfrac{16}{16+1.5+1.5+1.5}\right)\dfrac{(5.75)(2.5)}{(2.5)2.5} = 179\%$

FIG. 9

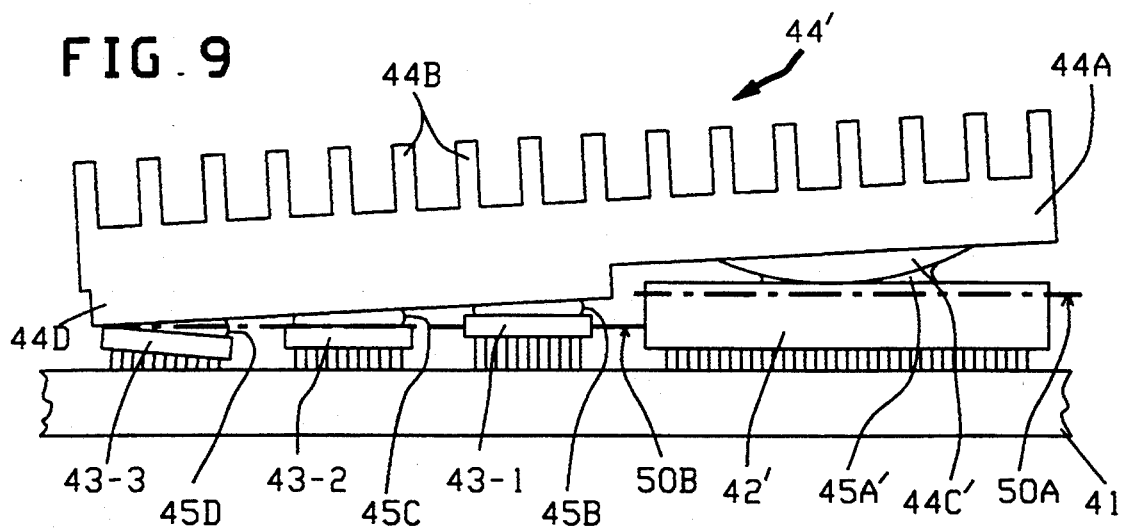

ELECTRO-MECHANICAL ASSEMBLY OF HIGH POWER AND LOW POWER IC PACKAGES WITH A SHARED HEAT SINK

BACKGROUND OF THE INVENTION

This invention relates to electro-mechanical assemblies of multiple integrated circuit packages (IC packages); and more particularly, it relates to the structure of a heat sink in such an assembly which cools at least two IC packages.

By an IC package is herein meant a thin-flat ceramic or plastic housing which encapsulates one or more integrated circuit chips and has dozens of input/output leads (I/O leads) that extend from the housing. Through these I/O leads, power and signals are sent to/received from each encapsulated chip. Conventionally, multiple IC packages are mounted on a printed circuit board by soldering their I/O leads to corresponding patterned conductors on the board. Also conventionally, multiple printed circuit boards are mounted side-by-side on a backplane which has several parallel spaced apart connectors, one for each printed circuit board.

Since the integrated circuit chips in the IC packages dissipate power, those IC packages get hot. Consequently, some cooling means must be provided to prevent the IC packages from getting overheated. Otherwise, certain maximum operating temperatures of the chips in the IC packages will be exceeded which in turn will cause those IC chips to degrade and/or fail.

Conventionally, the IC packages are cooled by attaching a separate heat sink to each IC package, and by providing one or more fans to blow air past the heat sinks. However, as the amount of power which an IC package uses is increased, the amount of heat which that IC package dissipates also increases. This additional heat can be removed by increasing the size of each sink; but eventually, a point is reached where there is no more room to further increase the heat sink size. On any one printed circuit board, the maximum heat sink width is limited by the distance to the adjacent IC packages, and the maximum heat sink height is limited by the distance to the next printed circuit board.

Alternatively, more fans can be added to blow the air past the heat sinks at a higher speed. However, adding fans increases the cost of the overall system. Further, as the speed of the air is increased, an increased amount of noise occurs due to the moving air, the moving fans, and the fan motors. Thus in a commercial product which needs to operate quietly, such as a desk top computer work station, a practical upper limit for the air speed is soon reached.

Accordingly, a primary object of the present invention is to provide a novel electro-mechanical assembly of multiple IC packages in which the above problems are overcome.

BRIEF SUMMARY OF THE INVENTION

In one preferred embodiment of the invention, the above object is achieved by an electro-mechanical assembly which includes a high power IC package and a low power IC package which are mounted on a printed circuit board with a space between them; and these two IC packages are cooled by a single heat sink. This heat sink has a thin flat core, with cooling fins that extend from its top; and the core overlies and completely covers both the high power and the low power IC packages as well as the space between them. Heat is drawn to the core from both of the IC packages through a pair of contact regions on the bottom of the core which are supported by the top surface of the IC packages with a thermal grease there between. With this assembly, improved cooling of the high power IC package is achieved when the ratio of the power dissipated by the high power IC package to the total power dissipated by both IC packages, times the ratio of total area covered by the heat sink core to the core area over the high power IC package, is greater than "1".

Also, due to various manufacturing tolerances, the top surfaces of the high power and the low power IC packages are non-coplanar with respect to each other. Despite this non-coplanarity, the thickness of the thermal grease is minimized, and thus each package's temperatures is reduced, by making the contact regions be respective projections from the core. Each projection is substantially smaller in average cross-sectional area, parallel to the core, than the top surface of the IC package which it contacts; and is long enough to prevent any portion of the core from resting on any portion of the IC packages.

BRIEF DESCRIPTION OF THE DRAWINGS

Various preferred embodiments of the invention, along with their features and advantages, are described herein in conjunction with the accompanying drawings wherein:

FIG. 2 is a set of equations which analyzes how the FIG. 1 assembly cools a high power IC package in that assembly;

FIG. 3 is a set of equations which analyzes a temperature rise that occurs in the FIG. 1 assembly between the high power IC package and an overlying heat sink in that assembly;

FIG. 8 is a set of equations which analyzes how the high power IC package in the electro-mechanical assembly of FIGS. 6 and 7 is cooled; and, FIG. 9 is a side view of an electro-mechanical assembly which is a third preferred embodiment of the present invention.

DETAILED DESCRIPTION

Figure 1:
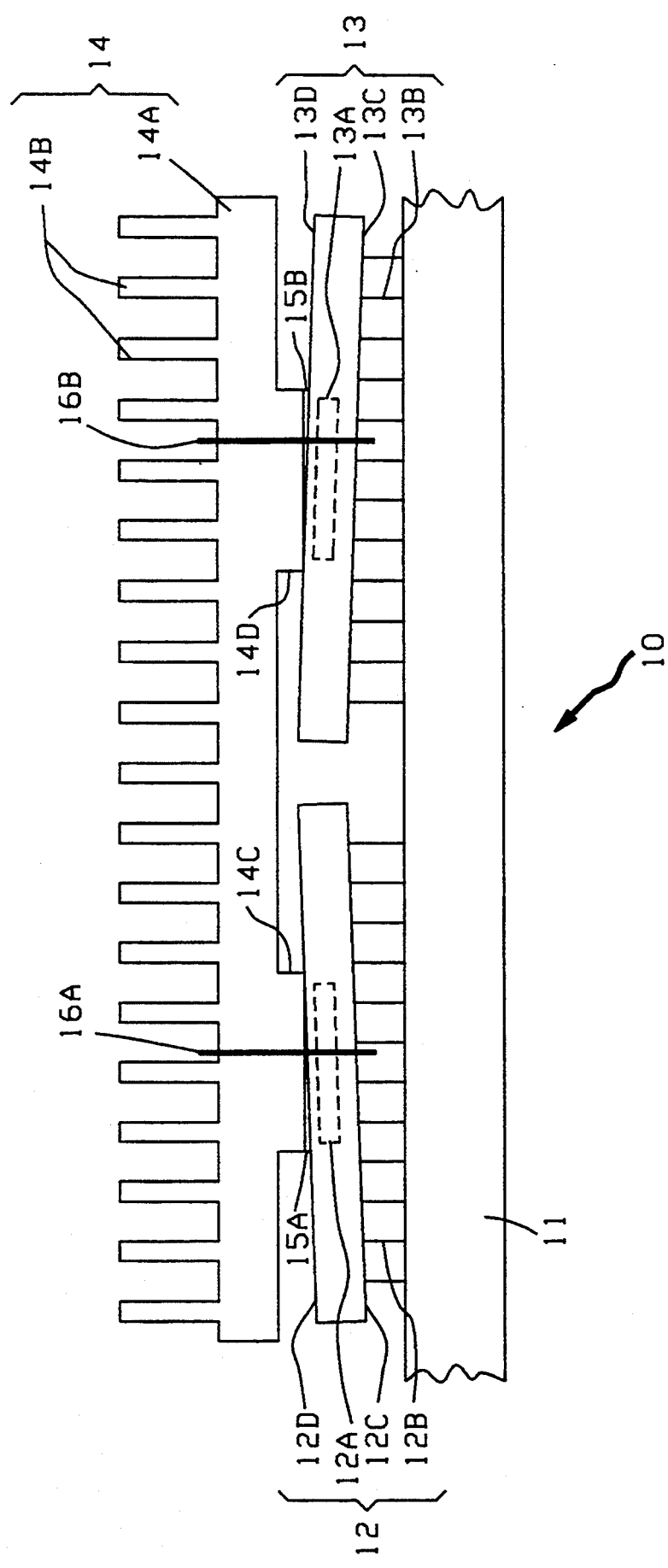
FIG. 1 shows a side view of an electro-mechanical assembly which is a first preferred embodiment of the invention.

Referring now to FIG. 1, an electro-mechanical assembly 10 which constitutes one preferred embodiment of the present invention will be described in detail. In this assembly 10, the main components are a printed circuit board 11, a high-power IC package 12 and a low-power IC package 13 which are non-coplanar with respect to each other, a single heat sink 14 which is shared by both of the IC packages 12 and 13, respective layers 15A and 15B of thermal grease between the heat sink 14 and the IC packages 12 and 13, and a pair of clamps 16A and 16B. All of these components are interconnected to each other as shown in FIG. 1.

Included within the high power IC package 12 is an integrated circuit chip 12A which uses a large amount of power and thus dissipates a large amount of heat. Electrical power is supplied to the chip 12A and electrical signals are sent to and received from the chip 12A through dozens of I/O leads 12B which extend from a flat bottom surface 12C of the IC package 12 and are soldered to corresponding conductors (not shown) on the printed circuit board 11.

Likewise, included in the low power IC package 13 is a low power integrated circuit chip 13A which uses a small amount of power and thus dissipates a small amount of heat. Electrical power is supplied to the chip 13A and electrical signals are sent to/received from the chip 13A by dozens of I/O leads 13B which extend from a flat bottom surface 13C of the IC package 13.

When the chips 12A and 13A are operating and dissipating heat, the vast majority of that heat travels upward through the IC packages 12 and 13 to their flat top surfaces 12D and 13D. This occurs because each of the chips 12A and 13A is in an air filled cavity and is attached to a surface of that cavity which lies directly below the IC package's top surface 12D or 13D.

In order to remove heat from both of the top surfaces 12D and 13D, the single heat sink 14 having a shape as shown in FIG. 1 is provided. That heat sink 14 has a thin flat core 14A which overlies and completely covers the top surfaces 12D and 13D of both the IC packages as well as the space between them. Extending across the entire top of the core 14A is an array of cooling fins 14B, and extending from the bottom of the core 14A are two projections 14C and 14D. Projection 14C is aligned with the chip 12A, and its cross-section parallel to the core 14A is slightly larger than the chip 12A. Likewise, projection 14D is aligned with the chip 13A, and its cross-section parallel to the core 14A is slightly larger than the chip 13A. Also, the projections 14C and 14D are long enough, in a direction perpendicular to the core, to ensure that the core does not touch the top surfaces 12D and 13D of the IC packages.

One important feature which is achieved by the assembly 10 can be seen by comparing that assembly to a conventional assembly wherein each of the IC packages have their own separate heat sink which is about half the size of the heat sink 14. This comparison is analytically made by equations 1 through 7 of FIG. 2.

Considering first equation 1 of FIG. 2, it expresses the temperature rise between the heat sink 14 and the surrounding air in terms of the power $W_{12}$ and $W_{13}$ that is dissipated by the chips 12A and 13A respectively, the surface area $S_{14}$ of the heat sink 14, and a heat transfer coefficient h. Each of these parameters is defined by equation 2.

For comparison purposes, suppose now that the heat sink 14 of the assembly 10 is cut in half between the two IC packages 12 and 13. In that case, equations 3 and 4 of FIG. 2 give the temperature rise between the heat sink on the high power IC package 12 and the surrounding air.

Note that in the above equation 1–4, all points on a heat sink are assumed to be at the same temperature, and the coefficient "h" is assumed to be one constant. This is an approximation which greatly simplifies the analysis and yet maintains fairly accurate qualitative results.

Next, the temperature rise as given by equation 3 can be compared to the temperature rise as given by equation 1 by taking the ratio of equation 3 to equation 1; and this comparison ratio is provided by equation 5. Inspection of equation 5 shows that the temperature of the heat sink 14 which is shared by the IC packages 12 and 13 will be smaller than the temperature of a separate heat sink for package 12 so long as the surface area ratio $S_{14} \div S_{14'}$ is greater than the power ratio $W_{12} \div (W_{12} + W_{13})$.

As a numerical example of equation 5, suppose that in the assembly 10, the high power chip 12A dissipates sixteen watts, the low power chip 13A dissipates four and one-half watts, and the top surfaces 12D and 13D of the IC packages 12 and 13 are essentially equal in area. This example is stated by equation 6. Substituting the numerical values of equation 6 into equation 5 yields equation 7, which shows the comparison ratio is 156%!

All of the numerical values which are given in equation 6 are representative of the power dissipation and package size in present-day digital computers. In particular, the equation 6 values for power and package size match the parameters of the recently announced Pentium microprocessor IC package from Intel Corporation and its cache controller IC package.

Still another feature of the assembly 10 is that even though the IC packages 12 and 13 have non-coplanar top surfaces, which is caused by various manufacturing tolerances as explained below, that non-coplanarity does not cause large temperature rises in the thermal grease 15A and 15B between the heat sink and the packages. This feature is due to the projections 14C and 14D on the heat sink 14, and it is analyzed by equations 20 through 27 of FIG. 3.

Beginning first with equation 20, it gives an expression for the temperature rise which occurs in the thermal grease 15A between the heat sink 14 and the high power package 12. This temperature rise is a function of several parameters which are defined by equation 21.

Inspection of equations 20 and 21 shows that the temperature rise from the heat sink to the package is directly proportional to the average thickness $t_1$ of the thermal grease 15A; and thus it is desirable to minimize that thickness. That grease thickness $t_1$ can be minimized by making the package top surfaces 12D and 13D perfectly coplanar with each other; however in any mass production environment, that is not possible.

When the assembly 10 is mass produced, the thickness of each of the IC packages 12 and 13 varies from package to package; and the IC package thickness also varies across each package from one side to the other. Further, when the assembly 10 is mass produced, the accuracy with which each of the IC package 12 and 13 can be mounted to the printed circuit board 11 also has certain tolerances. As a result, the top surfaces 12D and 13D of the IC packages are at different heights relative to the printed circuit board 11, and they are at different angles relative to the printed circuit board 11. In other words, the top surfaces 12D and 13D are misaligned in three dimensions.

Due to the above tolerances, the average thickness $t_1$ of the thermal grease 15A in the assembly 10 is not zero, but instead it is proportional to the half-width $x_1$ of the heat sink projection 14C. This is seen by inspection of FIG. 4, which is an enlarged view of the projection 14C as shown in FIG. 1.

Figure 5:
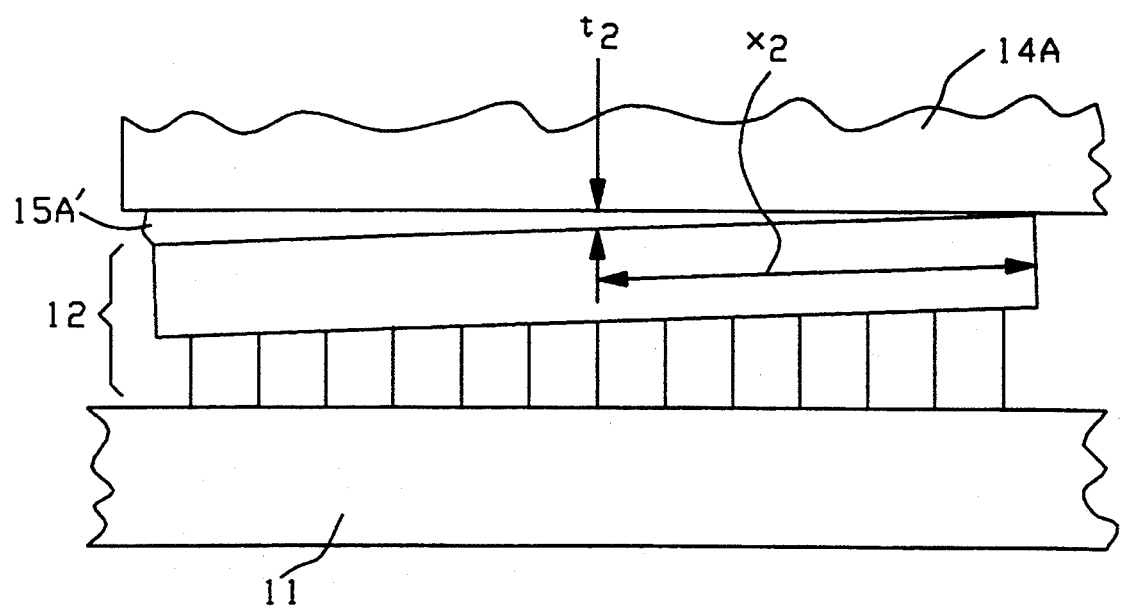
FIG. 5 shows how the thickness of the thermal grease in FIG. 4 is increased when the projection from the FIG. 4 heat sink is removed.

By comparison, suppose that the projections 14C and 14D were removed from the heat sink, and thus the heat sink core 14A rested on the integrated circuit package 12 as shown in FIG. 5. In that case, the thermal grease 15A' between the heat sink core 14A and the package 12 would have an average thickness $t_2$ which is proportional to the half-width $x_2$ of the IC package 12; and the temperature rise across that grease would be as expressed by equations 23 and 24 of FIG. 3.

Figure 4:
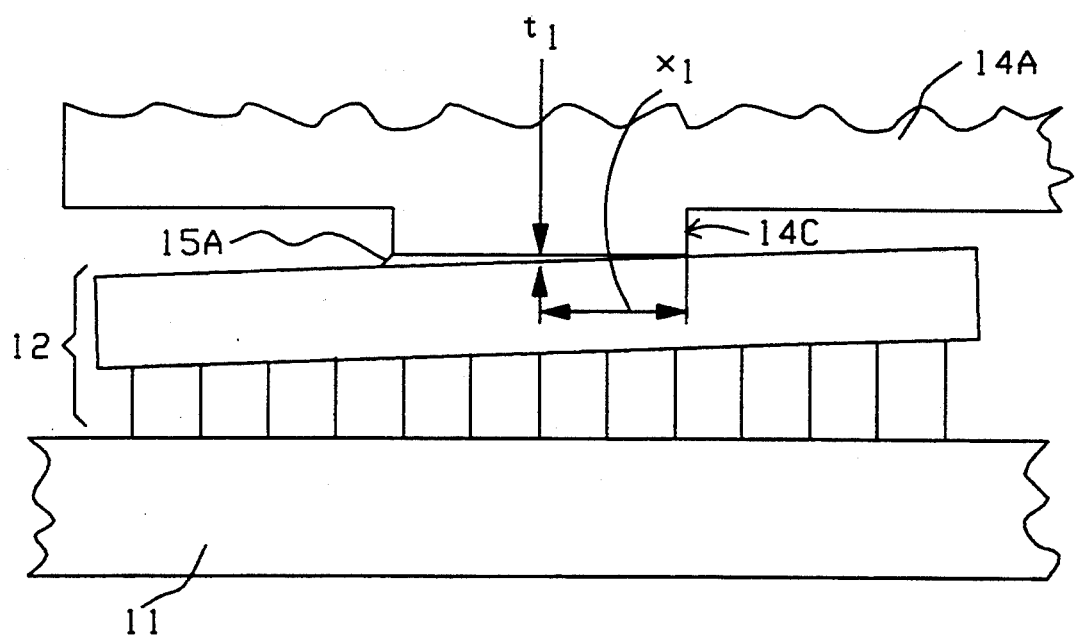
FIG. 4 is an enlarged view of the high power IC package and a portion of the overlying heat sink in FIG. 1.

In order to compare the temperature rise across the FIG. 5 grease 15A' to the temperature rise across the FIG. 4 grease 15A, equation 22 need only be divided by equation 20; and that is done by equation 24.

In equation 24, the parameters $A_1$ and $A_2$ respectively are the area of the heat flow through the grease in FIGS. 4 and 5; and those areas are approximately equal. This is because 1) essentially all of the heat flows upward from the chip 12A, and 2) the heat sink projection 14C is slightly larger than the top surface of chip 12A. This is stated by equation 25a.

Also in equation 24, the ratio of the grease thicknesses $t_1$ and $t_2$ is related to the ratio of the half-widths $x_1$ and $x_2$ of the heat sink projection 14C and the IC package 12. This relationship is given by equation 25b, and it is established from the geometry in FIGS. 2 and 3.

Substituting equations 25a and 25b into equation 24 yields equation 26. In words, equation 26 states that the ratio of the temperature rises that respectively occur across the thermal grease 15A and 15A' in FIGS. 4 and 5 is equal to the ratio of the projection half-width $x_1$ to the package half-width $x_2$.

A numerical example of the parameters $x_1$ and $x_2$ that represent present day integrated circuit packages is given by equation 27. There the parameter $2x_a$ is a suitable width for the projection 14C over an integrated circuit chip which is about 0.70 inches on a side, and the parameter $2x_2$ is a suitable width for an integrated circuit package that holds such a chip. Here again, these numerical values essentially equal those of the Pentium microprocessor. Substituting the numerical values of equation 27 into equation 26 yields equation 28, which says that the ratio of the temperature rise through the grease of FIG. 5 to the temperature rise through the grease of FIG. 4 is 254%!

One preferred embodiment 10 of the invention has now been described in detail. In addition however, many changes and modifications can be made to the details of that embodiment 10 without departing from the nature and spirit of the invention.

For example, suppose that a second low power IC package is mounted on the printed circuit board 10 of FIG. 1 spaced apart and out of line with the IC packages 12 and 13. In that case, the heat sink 14 can be enlarged such that its core 14A and cooling fins 14B overlie and cover all three of the integrated circuit packages plus the space between them; and a third projection, similar to the projections 14C and 14P, can be added to the core which is aligned with and covers the chip in the second low power IC package. With this modification, all three of the projections from the core will rest on the top surfaces of all three IC packages, despite the non-coplanarity of those surfaces, because three out of line points define a plane.

Figure 6:
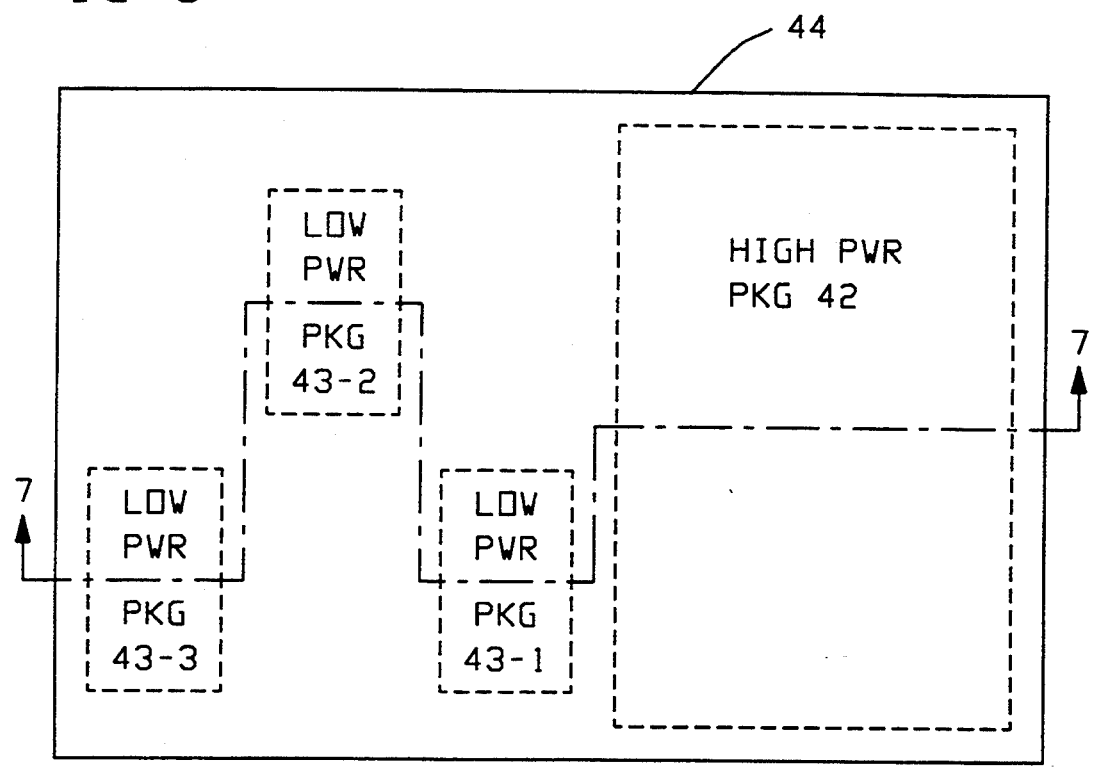
FIG. 6 is a top view of an electro-mechanical assembly which is a second preferred embodiment of the invention.
Figure 7:
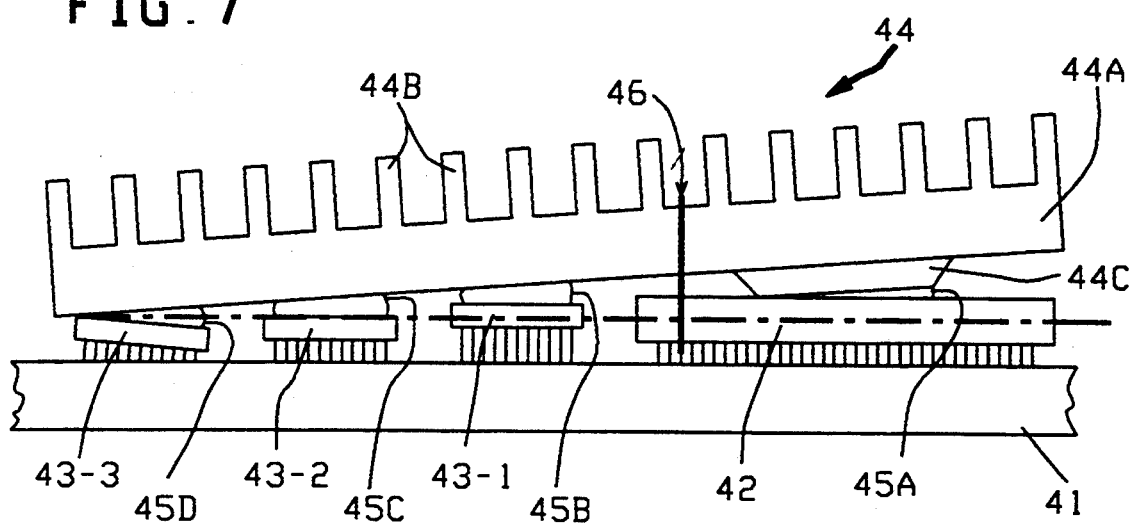
FIG. 7 is a side view of the electro-mechanical assembly of FIG. 6.

Still another modification is shown in FIGS. 6 and 7 wherein a high power IC package 42 and three low power IC packages 43-1, 43-2, and 43-3 are mounted in close proximity to each other on a printed circuit board 41. In this embodiment, all four of the IC packages are cooled with a single heat sink 44 which has a thin flat core 44A with cooling fins 44B that extend from the top thereof and which overlie and cover the four IC packages. Extending from the bottom of the core 44A is a single tapered projection 44C, and that projection is aligned with and about the same size in cross-section at its narrow end as the integrated circuit chip inside of the high-power IC package 42. Lying between the projection 44C and the top surface of the IC package 42 is a thin layer of thermal grease 45A, and lying between the bottom of the heat sink core 44B and each of the low-power IC packages are respective layers of thermal grease 45B, 45C, and 45D. A springy clamp 46 holds the heat sink to the IC packages.

Due to the heat sink projection 44C, the average thickness of the grease 45A between the high-power IC package 42 and the heat sink 44 is minimized even though the top surfaces of all of the IC packages 42, 43-1, 43-2, and 43-3 are non-coplanar with respect to each other. Consequently, the temperature rise through the grease 45A is minimized as was previously analyzed by equations 20 through 28 of FIG. 3. By comparison, the thermal grease layers 45B, 45C, and 45D have a larger average thickness; but those layers don't need to be thin since the IC packages which they are on use a low amount of power and thus dissipate less heat.

Also, since the heat sink core 44A and the cooling fins 44B extend over all of the IC packages 42, 43-1, 43-2, and 43-3, the temperature rise between the heat sink and the surrounding air is smaller than it would otherwise be if the heat sink 44 were cut such that each of the IC packages had its own separate heat sink which covered only it's top surface. In order to analyze the extent of this improvement, the comparison ratio as given by equation 5 of FIG. 2 need only be modified by making a substitution of variables as shown by equation 51 of FIG. 8. Substituting the variables of equation 51 into equation 5 gives the comparison ratio of equation 52.

Inspection of equation 52 shows that the heat sink 44 will cool the IC package 42 better than a separate heat sink 44' (not shown) which covers only the IC package 42 so long as the surface area ratio $S_{44} \div S_{44'}$ is larger than the power ratio $W_{42} \div (W_{42} + W_{43-1} + W_{43-2} + W_{43-3})$. A practical numerical example of the above ratios is given by equation 53. There, the high power IC package 42 dissipates sixteen watts whereas each of the low power IC packages dissipates one and one-half watts; and the surface area $S_{44}$ and $S_{44'}$ are measured directly from FIG. 7. Substituting the numerical values of equation 53 into equation 52 yields equation 54, which says the comparison ratio is 179%!

As still another modification, consider FIG. 9 wherein a thick high-power IC package 42' is mounted on the printed circuit board 41 with the low-power IC packages 43-1, 43-2, and 43-3. In this embodiment, the top surface of the high-power IC package 42' nominally lies in one plane 50A whereas the top surface of the low power IC packages nominally lie in a different plane 50B. To cool all of these IC packages, a heat sink 44' is provided which is the same as the FIG. 7 heat sink 44 except for two modifications. One modification is that the heat sink 44' has a stepped region 44D which extends from the bottom of the core 44A over all three of the low-power IC packages. The other modification is that the heat sink 44' has a semi-spherical projection 44C' to the high power IC package, rather than the tapered projection 44C. Preferably, the length of the stepped region 44D perpendicular to the core 44A is equal to the distance between the two planes 50A and 50B plus the length of the projection 44C' perpendicular to the core 44A.

As still further variations in all of the above described embodiments: 1) the angular difference in the orientation of the top flat surfaces of all of the IC packages can be as much as five degrees; 2) the I/O leads which are shown on the IC packages can be replaced with other types of I/O leads, such as solder bumps; and 3) the printed circuit board is just one type of interconnect substrate; and it can be replaced with any substrate that is suitable for interconnecting IC packages, such as a ceramic substrate. Also, the thermal grease can be any compliant mass with a high thermal conductivity; or alternatively, the thermal grease can be eliminated where the resulting reduction in cooling can be tolerated.

Also, as a variation on the FIG. 1 embodiment, the projection 14D from the heat sink core 14A to the low power IC package 13 can be eliminated, in which case the thermal grease 15B will lie directly between the heat sink core 14A and the top surface 13D of the low power IC package 13. However, this variation should only be used in those cases where the increased thickness of the thermal grease 15B which inherently results from the elimination of the heat sink projection 14D will not cause the low power IC package 13 to overheat.

Also, as a variation to all of the embodiments of FIGS. 1, 7, and 9, the core of the heat sink can be smaller in width, in a direction perpendicular to the figures, than the width of the high power IC packages 12, 42, and 42'; and in fact, it can be only half the width of those IC packages. In general, as was previously shown by equations 5 and 52, the present invention improves the cooling of the high power IC package so long as the ratio of the power dissipated by the high power IC package to the power of all of the IC packages which underlie the heat sink, times the ratio of total area covered by the heat sink core to the core area over the high power IC package is greater than "1". Preferably, to make the cooling improvement significant, the product of those two ratios is at least 110%.

Further, as another variation on the embodiments of FIGS. 1 and 7, the cross-sectional area at the end of the heat sink projections, parallel to the heat sink core, can be slightly smaller than the IC chip which those projections overlie. This is just a variation on equation 25A of FIG. 3. Also, in the embodiments of FIGS. 1, 7, and 9, each projection can be tapered from the core to the IC package like projection 44C of FIG. 7; or each projection from the heat sink core can be semi-spherical like projection 44C' of FIG. 9; or each projection can simply have a rounded tip. Further, if the top surfaces of the IC packages in FIGS. 1, 7, and 9 have little or no tilt in a direction perpendicular to the plane of those figures, then the projections from the heat sink core can extend in that direction completely across the IC package. But in all of the above variations, the ratio of the top surface area of an IC package to the average cross-sectional area of a projection to that IC package, in a plane parallel to the heat sink core, preferably is at least 130%. This insures that the thickness of any thermal grease at the projection-IC package interface is substantially reduced over that of FIG. 5. The above average cross-sectional area is obtained by—slicing the projection with N equally spaced planes which are parallel to the core (where N is a large number), summing the area of the projection in each such plane, and dividing that sum by N.

In view of all of the above described embodiments and their variations, it is to be understood that the invention is not limited to the details of any one particular embodiment but is defined by the appended claims.

What is claimed is:

1. An electro-mechanical assembly, comprising:
a high power IC package and a lower power IC package which are mounted with a space between them on a single substrate and which respectively contain a high power integrated circuit chip and a lower power integrated circuit chip;
said high power IC package and said lower power IC package having respective flat surfaces which dissipate heat and which are non-coplanar with each other;
a single heat sink having a thin flat core, with cooling fins extending from the top thereof, which overlies both said high power and said lower power IC packages as well as said space;
said heat sink further having first and second contact regions on the bottom of said core which respectively are supported by said flat surface of said high power and said lower power IC packages;
said first contact region being a projection from said core which is—a) substantially smaller in average cross-sectional area, parallel to said core, than said flat surface of said high power IC package, b) aligned with said high power integrated circuit chip, and c) long enough to prevent any portion of said core from touching any portion of said flat surface of said high power integrated circuit package despite said non-coplanarity; wherein, said projection is a rigid solid which provides a heat conducting path from said high power IC package to said heat sink core that has an average cross-section parallel to said core which is at least half as large as said high power integrated circuit chip.

2. An electro-mechanical assembly according to claim 1 wherein said high power integrated circuit package dissipates a power $W_H$, all of said integrated circuit packages together dissipate a power $W_T$; said heat sink core has a total area $S_T$ and an area over said high power integrated circuit package of $S_H$; and wherein $W_H \div W_T)(S_T \div S_H)$ is at least 110%.

3. An electro-mechanical assembly according to claim 1 wherein said flat surface of said high power integrated circuit package divided by the average cross-sectional area of said projection thereto is at least 130%.

4. An electro-mechanical assembly according to claim 1 wherein said cross-section of said projection, parallel to said core, is about the same size as said high power integrated circuit chip.

5. An electro-mechanical assembly according to claim 1 wherein said projection has a rounded tip on said high power IC package.

6. An electro-mechanical assembly according to claim 1 wherein a compliant mass having a high thermal conductivity is disposed between said projection and said high power IC package.

7. An electro-mechanical assembly according to claim 1 wherein said non-coplanarity between said integrated circuit packages includes an angular difference in the orientation of their flat surfaces of up to five degrees.

8. An electro-mechanical assembly according to claim 1 wherein said second contact region is a portion of the bottom of said thin flat core.

9. An electro-mechanical assembly according to claim 1 wherein said second contact region is a projection from said core which is—a) substantially smaller in cross-section than the flat surface of said lower power IC package, b) aligned with said lower power integrated circuit chip; and c) long enough to prevent any portion of said core from touching any portion of said flat surface of said lower power IC package despite said non-coplanarity.

10. An electro-mechanical assembly according to claim 1 wherein mounted on said substrate is another spaced apart lower power IC package which contains a lower power integrated circuit chip and has a non-coplanar flat surface which dissipates heat; said heat sink core and said cooling fine overlie all three of said IC packages plus said space there between; said heat sink has a third contact region on the bottom of said core; and each of said contact regions is a projection from said core which is—a) supported by the flat surface of a respective one of said IC packages and aligned with the integrated circuit chip therein; b) smaller in cross-section than the flat surface that it is supported by; and c) long enough to prevent any portion of said core from touching the flat surface of any of said IC packages despite their non-coplanarity.

11. An electro-mechanical assembly according to claim 10 wherein said high power IC package dissipates a power $W_H$, all of said IC packages together dissipate a power $W_T$, said heat sink core has a total area $S_T$ and an area over said high power IC package of $S_H$, and wherein $(W_H \div W_T)(S_T \div S_H)$ is at least 110%.

12. An electro-mechanical assembly according to claim 11 wherein the cross-sectional area of each projection is about the same size as the integrated circuit chip to which it is aligned.

13. An electro-mechanical assembly according to claim 12 wherein said non-coplanarity between said integrated circuit packages includes an angular difference in the orientation of their flat surfaces of up to five degrees.

14. An electro-mechanical assembly according to claim 13 wherein a compliant mass having a high thermal conductivity is disposed between said high power IC package and said projection thereto.

15. An electro-mechanical assembly according to claim 12 wherein: a) mounted on said substrate are at least two other spaced apart non-coplanar lower power IC packages each of which contains a lower power integrated circuit chip and has a non-coplanar flat surface which dissipates heat, b) said heat sink core and said cooling fins overlie all of said IC packages plus said space there between, and c) said second contact region is a stepped region from the bottom of said core which is supported by the flat surface of all of said lower power IC packages.

* * * * *